United States Patent
Rose

(10) Patent No.: US 8,766,098 B2
(45) Date of Patent: Jul. 1, 2014

(54) FOLDING HIGH VOLTAGE INSULATING COLUMN

(75) Inventor: Allen H. Rose, Cave Creek, AZ (US)

(73) Assignee: Alstom Grid, Phoenix, AZ (US)

( * ) Notice: Subject to any disclaimer, the term of this patent is extended or adjusted under 35 U.S.C. 154(b) by 106 days.

(21) Appl. No.: 13/264,106

(22) PCT Filed: Apr. 9, 2010

(86) PCT No.: PCT/US2010/030507
§ 371 (c)(1),
(2), (4) Date: Jan. 4, 2012

(87) PCT Pub. No.: WO2010/120643
PCT Pub. Date: Oct. 21, 2010

(65) Prior Publication Data
US 2012/0186853 A1      Jul. 26, 2012

Related U.S. Application Data

(60) Provisional application No. 61/212,612, filed on Apr. 14, 2009, provisional application No. 61/220,622, filed on Jun. 26, 2009.

(51) Int. Cl.
*H01B 17/00* (2006.01)

(52) U.S. Cl.
USPC ............. 174/135; 174/139; 174/79; 307/147

(58) Field of Classification Search
USPC .................. 174/135, 139, 179, 79; 307/147; 398/141
See application file for complete search history.

(56) References Cited

U.S. PATENT DOCUMENTS

| | | | |
|---|---|---|---|
| 5,159,158 A | 10/1992 | Sakich et al. | |
| 5,696,858 A | 12/1997 | Blake | |
| 6,188,811 B1 | 2/2001 | Blake | |
| 6,639,153 B2* | 10/2003 | Hauge | 174/135 |
| 6,897,384 B2 | 5/2005 | Fujii | |
| 7,535,132 B2* | 5/2009 | Devine et al. | 307/147 |
| 2002/0000802 A1 | 1/2002 | Panto et al. | |
| 2004/0071185 A1 | 4/2004 | Syracuse et al. | |

OTHER PUBLICATIONS

Chinese Office Action in corresponding Chinese Patent Application No. 201080016818.2 mailed Feb. 17, 2013 with partial English translation.
International Search Report for PCT/US2010/030507 mailed Nov. 17, 2010.
Written Opinion for PCT/US2010/030507 mailed Nov. 17, 2010.

* cited by examiner

*Primary Examiner* — Dhirubhai R Patel
(74) *Attorney, Agent, or Firm* — Patent Portfolio Builders PLLC

(57) ABSTRACT

A device for measuring current and/or voltage in a high voltage wire can be provided in a folding insulator. The mechanically folding insulator device can include a plurality of insulated sections. Pairs of insulated sections are coupled together by a link which allows for mechanical folding of said insulator device. The insulated sections of the folding insulator device have a cavity formed therein which contains an optical fiber surrounded by an insulative material.

15 Claims, 12 Drawing Sheets

FOLDING HIGH VOLTAGE INSULATING COLUMN

RELATED APPLICATIONS

The application claims priority to U.S. Provisional Patent Application No. 61/212,612, filed on Apr. 14, 2009, and U.S. Provisional Patent Application No. 61/220,622, filed Jun. 26, 2009, the disclosures of which are incorporated herein by reference.

TECHNICAL FIELD

The present invention relates generally to High Voltage insulators and, in particular, to High Voltage insulating methods, devices and systems for supporting the measurement of the characteristics of power lines.

BACKGROUND

Power lines are commonplace in today's society. Additionally, as populations continue to expand, and the industry within countries expands, the generation and distribution of power is expected to continue to grow. For example, high power distribution, e.g., 500 kV Direct Current and higher, are expected to expand. These lines are often placed in locations that can be considered to be relatively difficult to access as compared to lower power lines within a building. Additionally, high power lines have hazards of their own, associated with the high voltage (and current) levels within them.

Accordingly, systems and methods for safely measuring characteristics of such high power lines and other electrical lines are desirable.

SUMMARY

According to one exemplary embodiment, a mechanically folding insulator device includes a plurality of insulated sections, wherein pairs of the plurality of insulated sections are coupled together by a link which allows for mechanical folding of the insulator device, wherein the plurality of insulated sections have a cavity formed therein which contains an optical fiber surrounded by an insulative material.

According to another exemplary embodiment, a linking piece for allowing folding of an insulator device includes a linking piece with a substantially cylindrical body, wherein each end tapers into two oppositely facing parallel tabs, each of which has a similar size hole in a center of the tabs, a first fitting and a second fitting attachable to the insulator device for attaching the linking piece to the insulator device, a first rod for connecting the first fitting and the linking piece, and a second rod for connecting the second fitting and the linking piece, wherein when both of the first and the second rods are inserted, the insulator device can be folded with a folding motion with two degrees of motion in a single plane.

BRIEF DESCRIPTION OF THE DRAWINGS

The accompanying drawings illustrate exemplary embodiments, wherein.

DETAILED DESCRIPTION

The following detailed description of the exemplary embodiments refers to the accompanying drawings. The same reference numbers in different drawings identify the same or similar elements. Also, the following detailed description does not limit the invention.

Systems and methods according to exemplary embodiments can improve the measurement of (or the ability to measure) characteristics associated with power lines, e.g., high voltage lines, communication lines and the like. Additionally, systems and methods according to exemplary embodiments can improve the robustness and portability of measurement devices (and/or their associated insulators) in this environment as is described below. In order to provide context for this discussion, an exemplary environment for using an insulator assembly will now be described with respect to FIG. 1.

Figure 1:
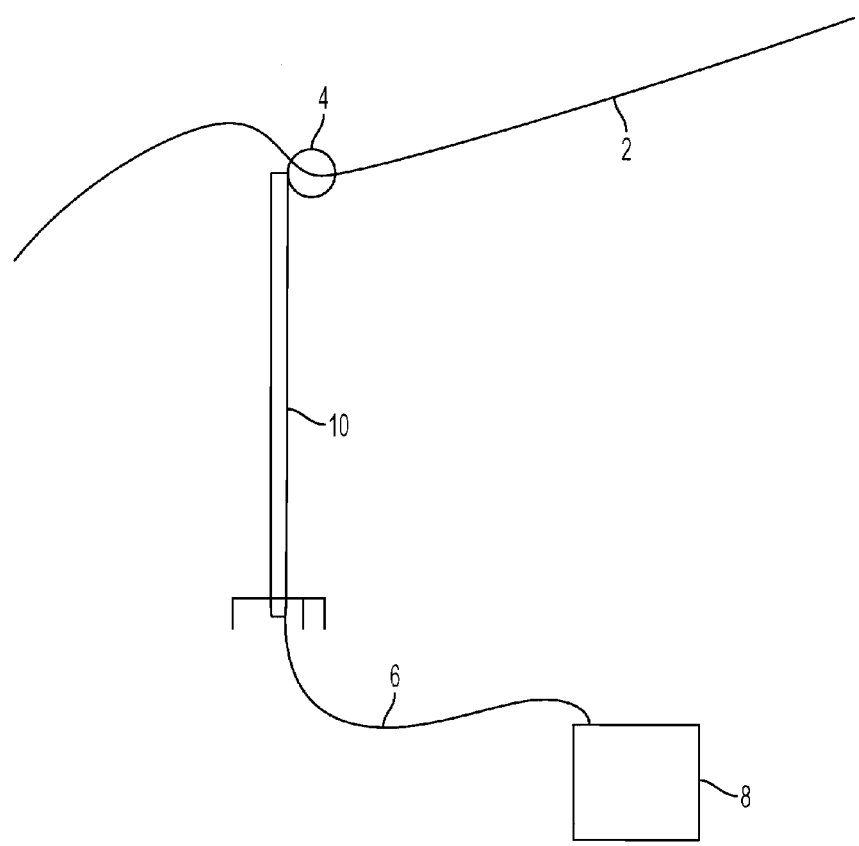
FIG. 1 shows an environment for using an insulator assembly.

FIG. 1 shows an insulator assembly 10 in a vertical position. At the top of the insulator assembly 10 is a sensing head 4 used for measuring one or more characteristics of the power line 2. The power line 2 can be a high voltage power line or other electrical line. A fiber optic line (not shown) runs from the sensing head 4 down to the bottom of the insulator assembly 10 and is connected to a connecting wire 6. A connecting wire 6 is then run to a measurement/control device 8 which uses the information collected by the sensing head 4, e.g., to calculate current and/or voltage information.

Figure 2A:
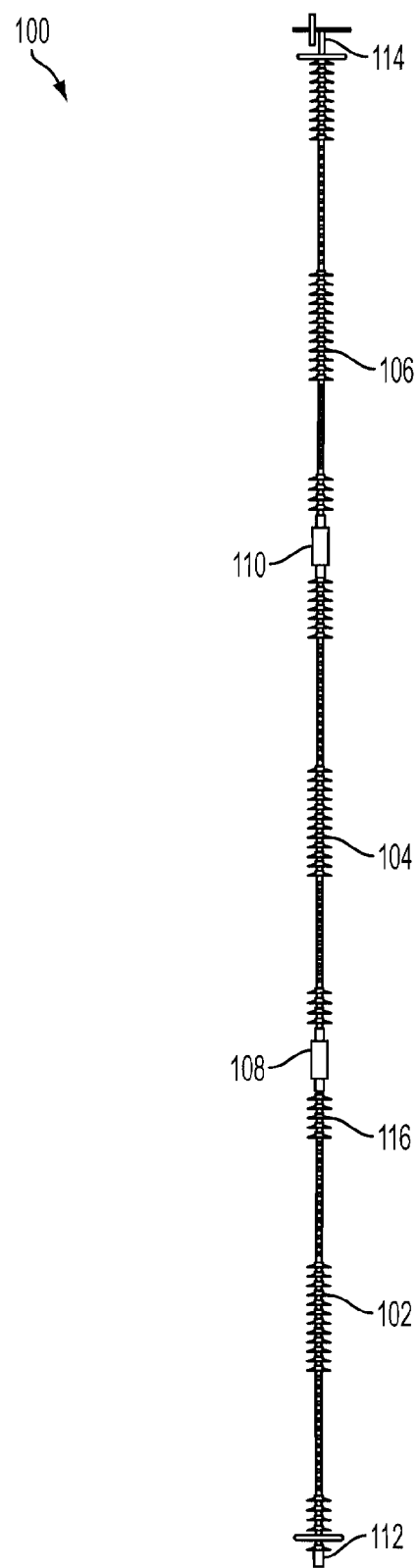
FIG. 2(a) shows a foldable insulator assembly locked into position according to exemplary embodiments.
Figure 2B:
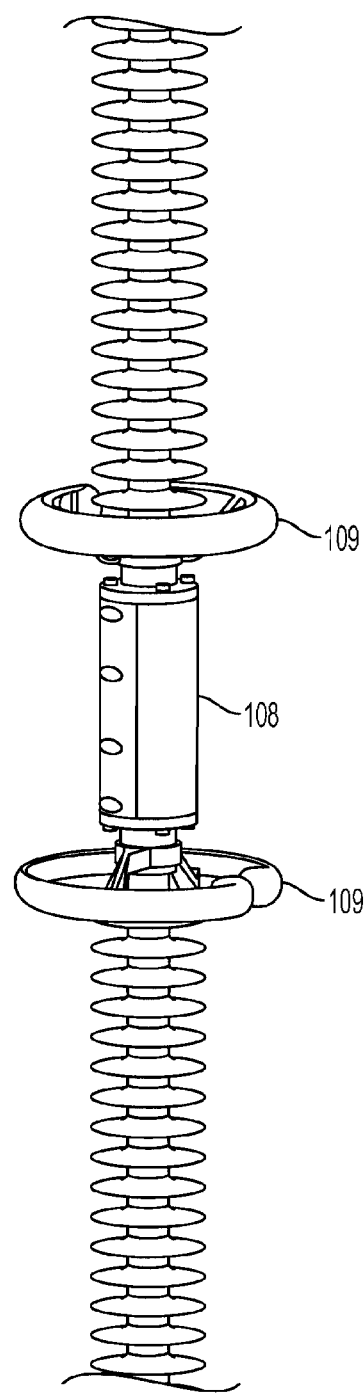
FIG. 2(b) illustrates a blown-up view of a mating cylinder according to exemplary embodiments.

According to exemplary embodiments, an insulator assembly 100 can be manufactured and assembled, as shown in FIGS. 2(a) and 2(b), which forms a rigid structure when unfolded and locked for placement onto a high voltage line as a suspension class insulator. As seen in FIG. 2(a), the insulator assembly 100 according to this exemplary embodiment includes three separate smaller insulator sections 102, 104 and 106 which are coupled together by couplings 108 and 110. A close-up of the coupling 108 is shown in FIG. 2(b). In this view, the coupling 108 is basically formed by attaching two partial cylindrical sections together which mate to allow for a rigid coupling of the insulator sections 102, 104 and 106. These couplings 108 and 110 are typically attached when assembling the insulator device for use (or testing as desired) and are typically not attached when leaving or placing the insulator assembly 100 in its folded state. Additionally, corona rings 109, for reducing corona discharge, can be placed on the exterior of the insulator assembly 100.

The insulator sections 102, 104 and 106 can be made of fiberglass in a rubber sheath with entry/exit ports and an inner cavity for an optical fiber (not shown) to run the length of the insulator assembly 100. Additionally, the insulator sections 102, 104 and 106 can include ports for injecting a gel, e.g., a silicone gel, into the optical fiber cavity. Between insulator sections 102, 104 and 106 the optical fiber is protected from mechanical stress and environmental conditions, e.g., weather effects, by a flexible watertight hose which runs internally to a metal link and is secured at each insulator section end. The flexible watertight hose can be a flexible stainless steel hose.

Figure 3A:
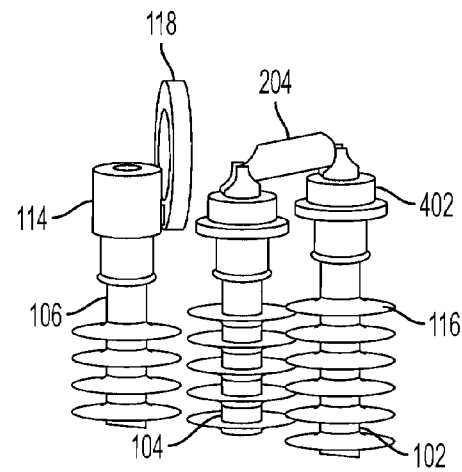
FIGS. 3(a)-3(c) show various portions of a foldable insulator assembly when folded according to exemplary embodiments.
Figure 3B:
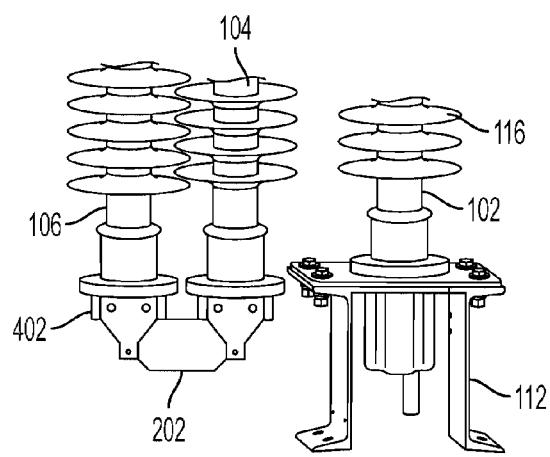

The insulator assembly 100 of FIG. 2(a), additionally includes a base section 112, a top section 114, and numerous sheds 116 (note there are more sheds 116 as shown but not labeled in FIG. 2(a) so as to not clutter up FIG. 2(a)) which are also shown in a closer view in FIGS. 3(a) and 3(b). Base section 112 and top section 114 provide, among other features, protection at the ends of insulator assembly 100 from physical handling damage and weather effects. Sheds 116 are typically made of silicon rubber and are generally circular in shape having an outer diameter larger than the inner diameter which has a different elevation (in at least one point) from the outer diameter. These sheds 116 perform the function of preventing a conductive path from pollutants, e.g., salt and water, being established on the exterior of the insulator assembly 100 based upon creepage distance. According to an alternative exemplary embodiment, different sizes and shapes of the sheds 116 can be used as needed to prevent an exterior conductive path from being created on the insulator assembly 100.

According to exemplary embodiments, the insulator assembly 100 is a relatively long, thin (as compared to its length) structure which can be folded. For example, according to one purely illustrative embodiment, the insulator assembly 100 is approximately 45 feet long and can include three roughly 15 feet long insulator sections 102, 104 and 106. Alternatively, differing lengths/sizes of the insulator assembly 100 can be used, a different number of insulator sections can be used. This folding capability of insulator structures according to these exemplary embodiments allows for ease of transport, as well as an increased robustness of design, and an easier method of manufacturing as compared with a single, lengthy, non-folding insulator assembly.

Figure 3C:
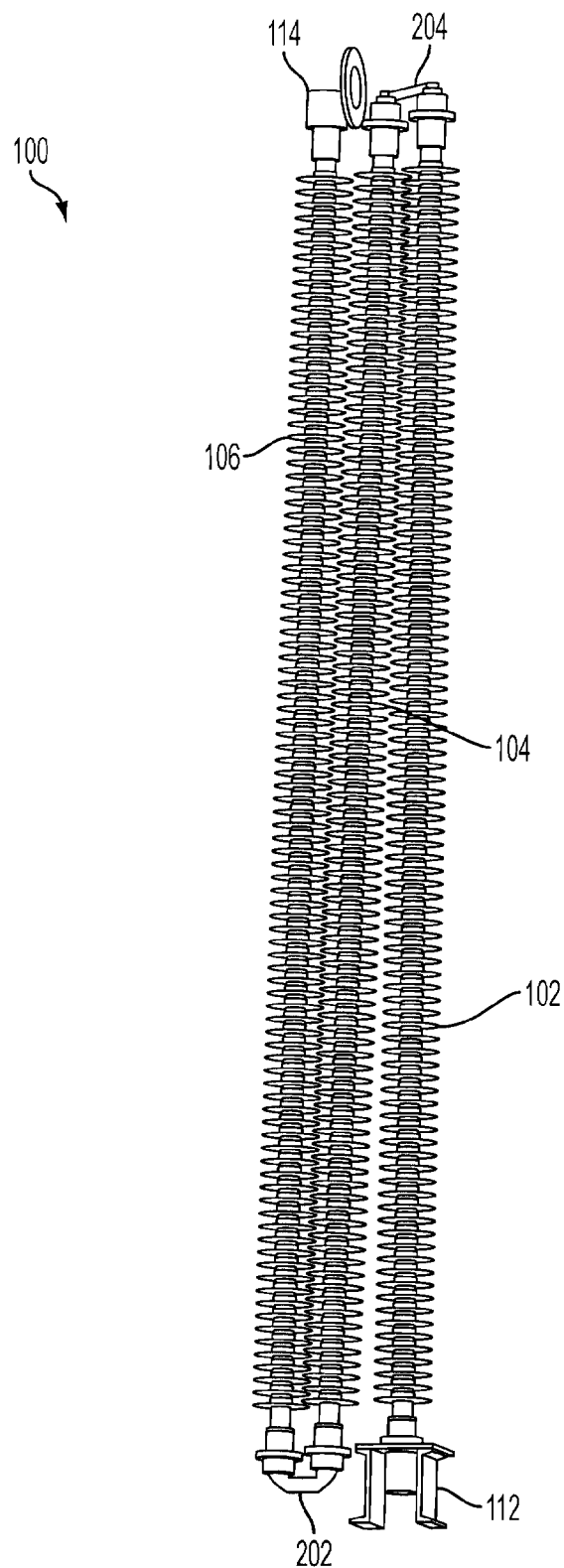
Figure 4A:
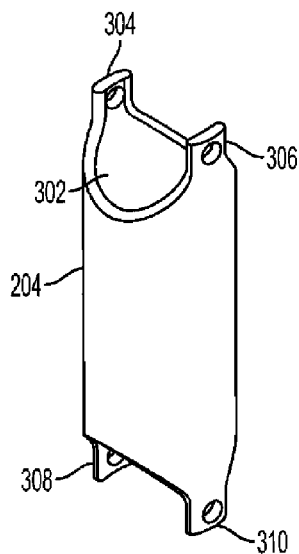
FIGS. 4(a)-4(d) depict the link from various view perspectives according to exemplary embodiments.
Figure 4B:
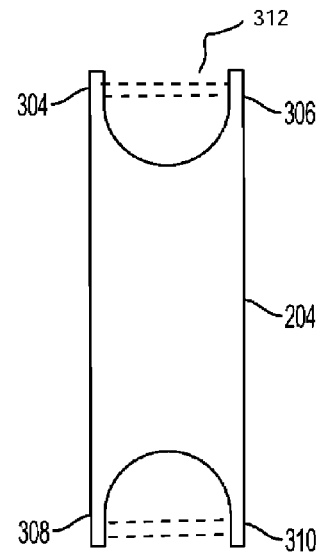
Figure 4C:
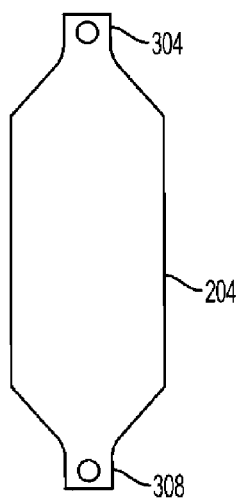
Figure 4D:
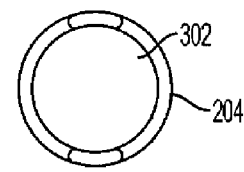
Figure 5A:
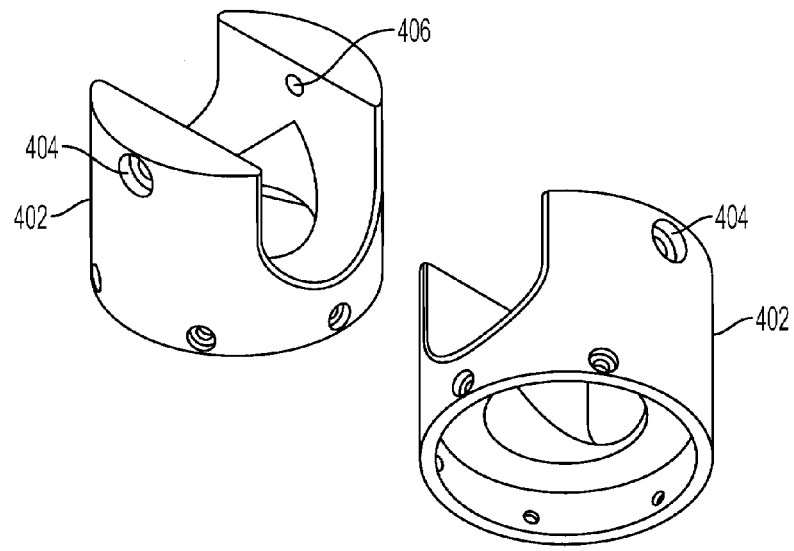
FIGS. 5(a)-5(e) show an end fitting from various view perspectives according to exemplary embodiments.
Figure 5B:
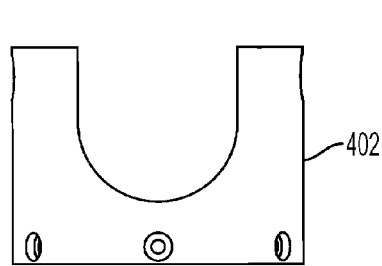
Figure 5C:
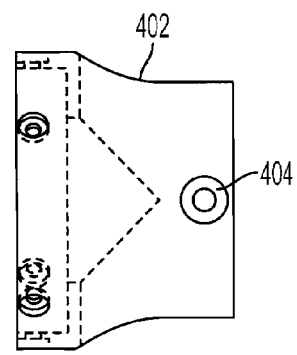
Figure 5:
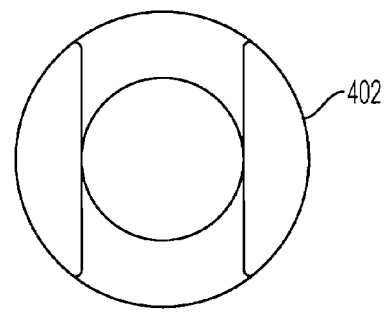
Figure 5:
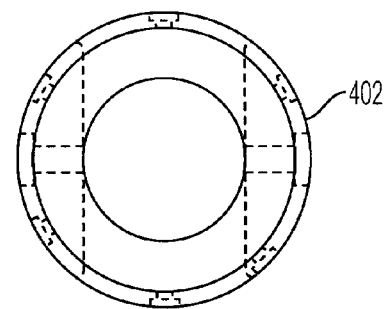

According to exemplary embodiments, as described above, insulator assembly 100 can be folded into various sections as shown in its entirety in FIG. 3(c). As shown in FIG. 3(c), links 202 and 204 connect the insulator sections 102, 104 and 106. The links 202 and 204 are each a metal link, at least in this example, which has a cavity through which a flexible water tight hose can be run, that is secured at each insulator section end. These links will typically also contain the optical fiber which is inside the flexible water tight hose and passes through the folding insulator assembly 100. More details regarding the links 202 and 204 are provided below. Additionally, a larger scale view of the folding sections of the insulator assembly 100 is shown in FIG. 3(b). Also, according to exemplary embodiments, the insulator sections 102, 104, and 106 are held together and are allowed two degrees of freedom of constrained motion to enable the folding action. This collapsed insulator assembly 100 allows for a smaller shipping profile, which in turn allows for a more easily protected insulator assembly 100.

According to exemplary embodiments, insulator assembly 100 can be manufactured in separate segments prior to assembly. For example, each insulator section 102, 104, and 106 can be fabricated to its desired length specification(s) and then filled with gel prior to assembling all of the insulator sections together. The gel is typically pumped into each insulator section 102, 104, and 106 from the bottom, with each insulator section 102, 104, 106 being disposed in a vertical position to force out gas pockets from within the cavity of each insulator section 102, 104, 106 as the gel is being inserted. Advantages associated with using shorter sections (as compared to a single long section) include the ease of inserting the gel from the bottom, the smaller space required for setup, and a shorter time to fill a section which can be relevant depending up various properties of the gel, e.g., cure time of the gel. However, the recognition of these advantages should not be construed as limiting each section to the exemplary lengths described herein. Each flexible watertight hose section typically is not gel-filled. Additionally, the optical fiber is placed within the insulator section 102, 104, 106 prior to gel insertion. The insulator sections 102, 104, 106 can be made of composite or ceramic materials to obtain the desired properties, e.g., insulation amount (resistivity), strength, corrosion resistance and the like.

As described above, the insulator assembly 100 can be fabricated from different parts according to these exemplary embodiments. These parts are described in more detail below. According to exemplary embodiments, FIGS. 4(a)-4(d) show various views of the link 204. Link 204 is made of a material, e.g., schedule 80 aluminum pipe, with the desired properties for use as part of a joint in insulating assembly 100. The link 204 acts as a chain link with two pivot points for constraining the mechanical folding of the insulator assembly 100 to two degrees of motion in a single plane. Inside of the link 204 is a cavity 302 through which the optical fiber, which extends the length of the insulator assembly, runs. The optical fiber (not shown) is protected in the cavity 302 by being inside of a hose (not shown), e.g., a flexible watertight, formed metal hose. The pivot points are disposed at each end of the link 204 and are created by inserting, for example, a rod 312, bolt or the like, through each of the two sets of holes located in each of the tabs 304, 306, 308 and 310. Each set of holes is aligned on the same axis, and the inner face of each tab set is roughly parallel with its opposite tab face, i.e., the inner facing of tab 304 is roughly parallel with the inner facing of tab 306 in the section of the tab 304, 306 where its respective hole is located.

According to exemplary embodiments, as described above, the link 204 is attached to a pair of end fittings which are attached to the ends of the insulated sections 102, 104, 106 where folding is desired. FIGS. 5(a)-5(e) show various views and drawings of the end fitting 402. The end fitting 402 has holes 404 and 406 through which a rod or bolt (not shown), is inserted which also passes through two of the holes on link 204, e.g., a pair of holes 304, 306 located at an end of link 204. This joint acts as the pivot point for folding and also attaches the link to the end fitting 402. End fitting(s) 402 are attached, as shown in FIGS. 3(a) and 3(b), to an insulator section 102, 104, 106. End fitting 402 can be attached to an insulator section 102, 104, 106. Attachment mechanisms can include bolting, adhesive, press fitting, combinations of these options and the like. Also according to exemplary embodiments as described above, the optical fiber which runs the length of the assembly passes through the end fitting(s) 402 into the link 204 through a hose (or a part which performs a similar function), which protects the optical fiber. Additionally, watertight seals are used at the location(s) where the optical fiber enters/exits the hose/insulator section interface.

Figure 6A:
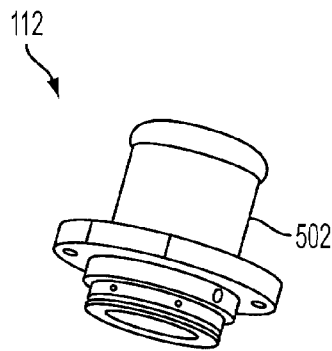
FIGS. 6(a) and 6(b) show a bottom section from two view perspectives according to exemplary embodiments.
Figure 6B:
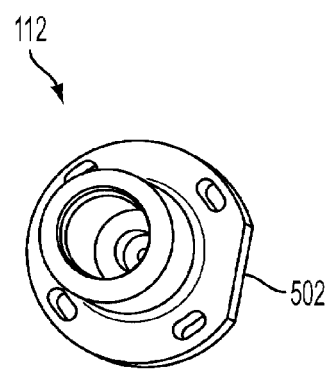
Figure 6C:
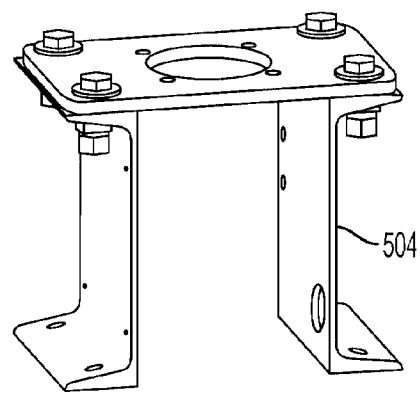
FIG. 6(c) depicts a mounting bracket according to exemplary embodiments.

According to exemplary embodiments, the insulator assembly 100 has a bottom section 112 which includes an insulating bottom fitting 502 and an optional mounting bracket 504, both of which are shown in more detail in FIGS. 6(a)-6(c). FIGS. 6(a) and 6(b) show two different views of the insulator bottom fitting 502. The insulator bottom fitting 502 caps one end of the insulator assembly 100. Additionally, the insulator bottom fitting is where the optical fiber (not shown) enters/exits the insulator assembly 100. The optic fiber can be terminated in a connection which leads to different monitoring equipment depending upon the feature being measured, e.g., current or voltage. Insulator bottom fitting 502 can also be attached to a mounting bracket 504 as shown in FIG. 6(c), which can be mounted to a solid support.

Figure 7:
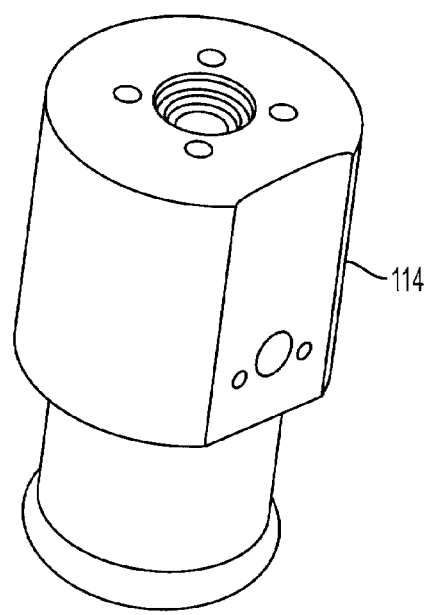
FIG. 7 shows a top section (without a sensing head) according to exemplary embodiments.

According to exemplary embodiments, the insulator assembly 100 has a top section 114, which is shown in more detail in FIG. 7. The top section 114 (also known as the "pillow") caps one end of the insulator assembly 100. Mounted to the top section 114 can be one of a plurality of various sensing heads, which are also in contact with the optic fiber. An example of a sensing head is shown as the ring 118 in FIG. 3(a). This ring 118 (or other sensing head attached to top section 114) can be used to sense (or measure) characteristics of the associated electrical line. Examples of such sensing equipment can be found in U.S. Pat. Nos. 6,188,811 and 5,696,858, to James Blake, the disclosures of which are incorporated here by reference. This data is transmitted through the attached optic fiber to a measuring device 8 which can be connected to insulator assembly 100.

According to exemplary embodiments, advantages include the provision of a high voltage insulator that folds mechanically for reduced length, wherein the folding motion of the insulator sections is constrained to two degrees of motion in one plane. The folding assembly can be locked together to form a rigid mechanical assembly, and the insulator sections contain a cavity running the length of the insulator for an optical fiber, which can be filled with a sealing silicone gel. The folding high voltage insulator sections can be made of composite or ceramic materials. However, it will be appreciated that the present invention is not limited to embodiments which contain one, some, or all of these advantages. According to another exemplary embodiment, a folding insulator device includes: a plurality of insulated sections, wherein pairs of the plurality of insulated sections are coupled together by a link, which allows for mechanical folding of the insulator device, wherein the plurality of insulated sections have a cavity formed therein, which contains an optical fiber surrounded by an insulating material.

Figure 8:
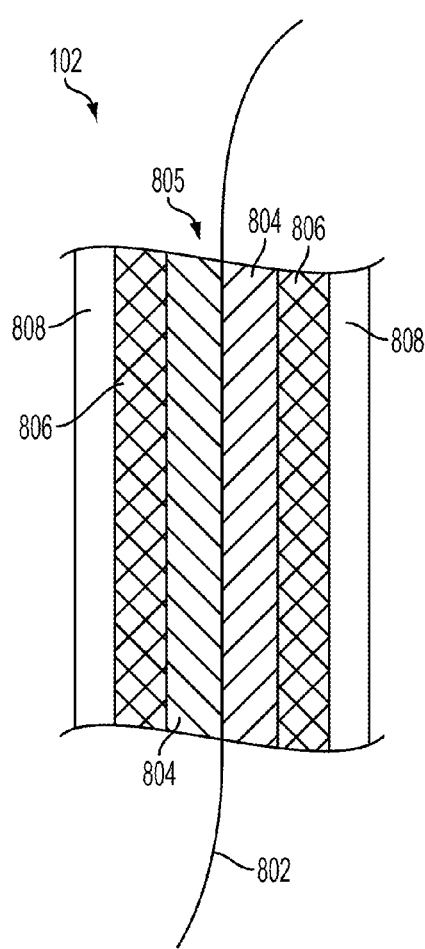
FIG. 8 shows a cross-section of an insulator section according to exemplary embodiments.

According to exemplary embodiments, an insulator section 102, 104, 106 can be manufactured and assembled as shown in FIG. 8. FIG. 8 shows a cross section of an insulator section 102. In the center of the cross section, an optical fiber 802 runs the length (and beyond, through the entire insulator assembly 100) of the insulator section 102 and is surrounded by a silicone gel 804 in the inner cavity. Surrounding the silicone gel 804 is the fiberglass section 806, which in turn is surrounded by a rubber sheath 808. The fiberglass section 806 can also be treated to generate the desired bond with the silicone gel. Additionally, different types of materials can be used as desired.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention. For example, lines other than high voltage lines can have measurements taken from them using insulator assembly 100, such as, for example, communication lines. No element, act, or instruction used in the description of the present application should be construed as critical or essential to the invention unless explicitly described as such. Also, as used herein, the article "a" is intended to include one or more items.

The invention claimed is:

1. A mechanically folding insulator device comprising:
a plurality of insulated sections; wherein pairs of said plurality of insulated sections are coupled together by a link which allows for mechanical folding of said insulator device, wherein said plurality of insulated sections have an inner cavity formed therein which contains an optical fiber surrounded by an insulative material.

2. The folding insulator device of claim 1 further comprising:
a base section; and
a top section.

3. The folding insulator device of claim 2, wherein said top section includes a sensing device.

4. The folding insulator device of claim 3, wherein said sensing device is a current sensing or communication device.

5. The folding insulator device of claim 3, wherein said sensing device is a voltage sensing device.

6. The folding insulator device of claim 1, wherein said insulator sections are formed of fiberglass surrounded by a rubber sheath.

7. The folding insulator device of claim 6, wherein said insulative material is a gel which fills said cavity in said plurality of insulated sections.

8. The folding insulator device of claim 7, wherein said gel is a silicone gel which approximately matches a dielectric strength of said fiberglass.

9. The folding insulator device of claim 1, wherein said link has a hollow section and further comprising:
a flexible hose disposed in said hollow section and containing a section of said optical fiber.

10. The folding insulator device of claim 1, wherein said folding of said insulator device is constrained to two degrees of motion in a single plane.

11. The folding insulator device of claim 1, further comprising:
a collar disposed over said link when said folding insulator device is in its unfolded state to provide rigidity.

12. The folding insulator device of claim 11, wherein said collar is formed from two halves of a cylinder.

13. The folding insulator device of claim 11 further comprising:
a linking piece with a substantially cylindrical body, wherein each end tapers into two oppositely facing parallel tabs, wherein each of two oppositely facing parallel tabs has a similar size hole in center of said tabs, forming a set of holes on each end of said linking piece;
a first fitting and a second fitting attachable to said insulator device for attaching said linking piece to said insulator device, wherein said first fitting and said second fitting each have a pair of holes;
a first rod for connecting said first fitting and said linking piece; and
a second rod for connecting said second fitting and said linking piece, wherein when said first rod is inserted through said pair of holes of said first fitting and said set of holes at one end of said linking piece and wherein when said second rod is inserted through said pair of holes of said second fitting and said set of holes at the other end of said linking piece, said insulator device can be folded with a folding motion with two degrees of motion in a single plane.

14. The folding insulator device of claim 1, further comprising a plurality of sheds, wherein said plurality of sheds are made from silicone rubber and disposed on said insulator device at intervals to disrupt potential exterior conductive paths.

15. A linking piece for allowing folding of an insulator device comprising:
- said linking piece with a substantially cylindrical body, wherein each end tapers into two oppositely facing parallel tabs, wherein each of two oppositely facing parallel tabs has a similar size hole in center of said tabs, forming a set of holes on each end of said linking piece;
- a first fitting and a second fitting attachable to said insulator device for attaching said linking piece to said insulator device, wherein said first fitting and said second fitting each have a pair of holes;
- a first rod for connecting said first fitting and said linking piece; and
- a second rod for connecting said second fitting and said linking piece, wherein when said first rod is inserted through said pair of holes of said first fitting and said set of holes at one end of said linking piece and wherein when said second rod is inserted through said pair of holes of said second fitting and said set of holes at the other end of said linking piece, said insulator device can be folded with a folding motion with two degrees of motion in a single plane.

* * * * *